(12) United States Patent
Mitani et al.

(10) Patent No.: US 11,269,118 B2
(45) Date of Patent: Mar. 8, 2022

(54) OPTICAL SEMICONDUCTOR ELEMENT COATING SHEET

(71) Applicant: EPISTAR CORPORATION, Hsinchu (TW)

(72) Inventors: Munehisa Mitani, Osaka (JP);
Hirokazu Matsuda, Osaka (JP);
Kazuaki Suzuki, Osaka (JP)

(73) Assignee: EPISTAR CORPORATION, Hsinchu (TW)

( * ) Notice: Subject to any disclaimer, the term of this patent is extended or adjusted under 35 U.S.C. 154(b) by 207 days.

(21) Appl. No.: 16/331,716

(22) PCT Filed: Aug. 28, 2017

(86) PCT No.: PCT/JP2017/030761
§ 371 (c)(1),
(2) Date: Apr. 24, 2019

(87) PCT Pub. No.: WO2018/047658
PCT Pub. Date: Mar. 15, 2018

(65) Prior Publication Data
US 2020/0116905 A1 Apr. 16, 2020

(30) Foreign Application Priority Data

Sep. 8, 2016 (JP) .............................. JP2016-175379

(51) Int. Cl.
*G02B 5/02* (2006.01)
*H01L 33/58* (2010.01)

(52) U.S. Cl.
CPC ............ *G02B 5/0242* (2013.01); *H01L 33/58* (2013.01); *G02B 5/0268* (2013.01)

(58) Field of Classification Search
CPC .. G02B 5/0242; G02B 5/0205; G02B 5/0275; B32B 7/02; B32B 7/023; H01L 33/58; H01L 33/22; H01L 2933/0095
USPC ......................................................... 359/599
See application file for complete search history.

(56) References Cited

U.S. PATENT DOCUMENTS

| 2008/0315228 | A1 | 12/2008 | Krames et al. |
| 2011/0006316 | A1 | 1/2011 | Ing et al. |
| 2011/0157515 | A1* | 6/2011 | Li ........................... G02B 5/223 349/62 |
| 2013/0063939 | A1* | 3/2013 | Kondo .................... H01L 33/52 362/235 |

(Continued)

FOREIGN PATENT DOCUMENTS

| CN | 101897041 A | 11/2010 |
| CN | 104471692 A | 3/2015 |

(Continued)

OTHER PUBLICATIONS

Tanaka et al JP2010271517 translation, ProQuest, obtained Dec. 1, 2020 (Year: 2010).*

(Continued)

*Primary Examiner* — Kristina M Deherrera
(74) *Attorney, Agent, or Firm* — Patterson + Sheridan, LLP

(57) ABSTRACT

A sheet used for coating an optical semiconductor element is used for directly or indirectly covering an optical semiconductor element, and includes a white layer containing white particles; and a light diffusion layer containing light-diffusing particles, in this order in a thickness direction.

8 Claims, 7 Drawing Sheets

(56) References Cited

U.S. PATENT DOCUMENTS

| | | |
|---|---|---|
| 2015/0060905 A1 | 3/2015 | Nam et al. |
| 2019/0227424 A1* | 7/2019 | Li .................. G03B 21/625 |

FOREIGN PATENT DOCUMENTS

| | | |
|---|---|---|
| CN | 105518882 A | 4/2016 |
| EP | 1657756 A2 | 5/2006 |
| EP | 2571067 A3 | 11/2013 |
| JP | 2008047460 A | 2/2008 |
| JP | 2010168525 A | 8/2010 |
| JP | 2010271517 A | 12/2010 |
| JP | 2010537400 A | 12/2010 |
| JP | 2011011365 A | 1/2011 |
| JP | 2011507255 A | 3/2011 |
| JP | 2012078857 A | 4/2012 |
| JP | 2013168599 A | 8/2013 |
| JP | 2014038757 A | 2/2014 |
| JP | 2014157989 A | 8/2014 |
| JP | 2015164216 A | 9/2015 |
| JP | 2016048764 A | 4/2016 |
| TW | 201605075 A | 2/2016 |
| WO | 2010106999 A1 | 9/2010 |
| WO | 2015166022 A1 | 11/2015 |

OTHER PUBLICATIONS

JP2014037857A, Funayama, Katsuya et al. (2014) English translation Google Patents.*

International Search Report and Written Opinion for PCT/JP2017/030761 dated Nov. 21, 2017, with translation.

* cited by examiner

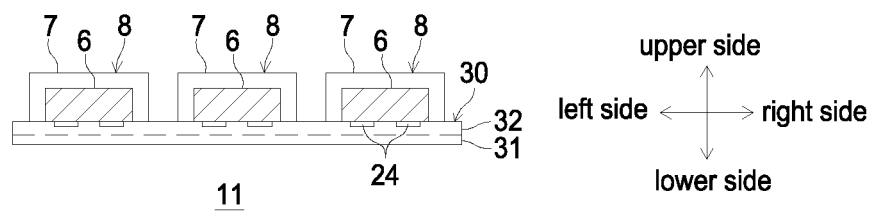
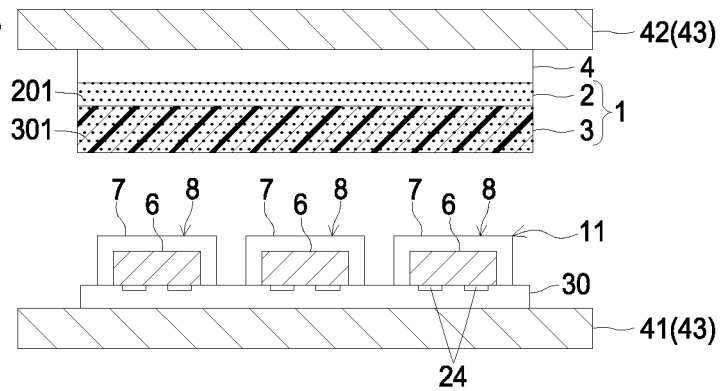
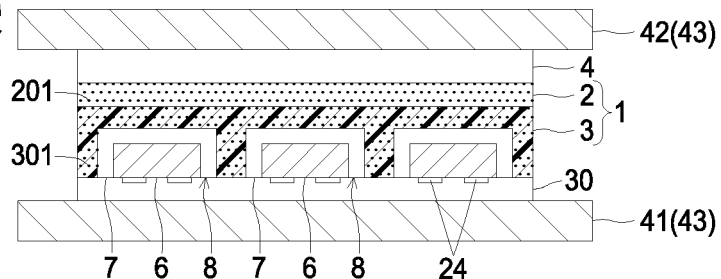
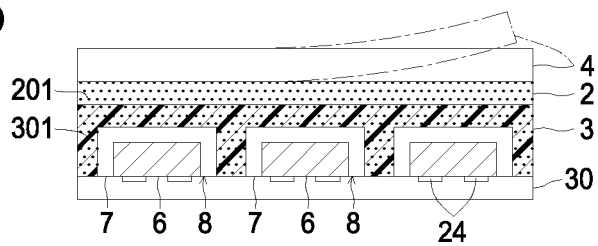
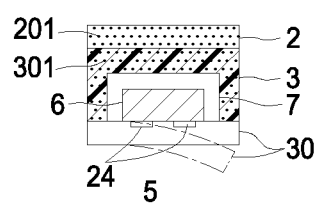
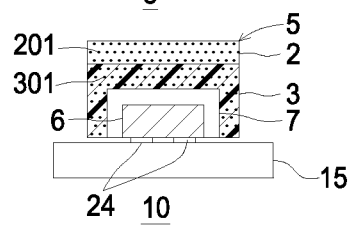

OPTICAL SEMICONDUCTOR ELEMENT COATING SHEET

BACKGROUND OF THE INVENTION

1. Field of the Invention

The disclosure herein generally relates to a sheet for covering an optical semiconductor element.

2. Description of the Related Art

Conventionally, an optical semiconductor light-emitting device emitting white light has been known as a light-emitting device capable of emitting high energy light. The optical semiconductor light-emitting device emitting white light includes, for example, an LED disposed on the diode substrate and capable of emitting blue light; and a phosphor layer coated on the LED and capable of converting blue light into yellow light. The optical semiconductor light-emitting device emits white light with high energy by mixing blue light and yellow light. The blue light is emitted from the LED and passes through the phosphor layer. The yellow light is converted from a portion of blue light through the phosphor layer.

As the aforementioned optical semiconductor light-emitting device, for example, patent document 1 has been proposed an optical semiconductor light-emitting device. The optical semiconductor light-emitting device disclosed in patent document 1 includes an optical semiconductor multilayer film including a light-emitting layer, a growth substrate, and a phosphor film formed to cover a side surface and an upper surface (opposite to the growth substrate) of the optical semiconductor multilayer film.

According to the optical semiconductor light-emitting device disclosed in patent document 1, it can enhance a yield of the optical semiconductor light-emitting device without increasing in size.

CITATION LIST

Patent Literature

[PTL 1] Japanese Unexamined Patent Application Publication No. 2005-252222

SUMMARY OF THE INVENTION

Technical Problem

However, in the optical semiconductor light-emitting device disclosed in Patent Document 1, there is a problem that light emitted from the semiconductor multilayer film and passing through the phosphor film is non-uniform due to different emitting angle. Specifically, light emitted in an oblique direction is more yellow than light emitted in a front direction (upward). As a result, the color is non-uniform due to different emitting angle. Particularly, when the optical semiconductor light-emitting device is observed in the front direction, there is a yellow ring shown with the white light.

Moreover, typically, a yellow phosphor is often used as the phosphor layer. Thus, when not emitting light, the optical semiconductor light-emitting device appears in yellow color, and a design of appearance is deteriorated.

The purpose of the present invention is to provide a sheet for coating an optical semiconductor element. The optical semiconductor element with this sheet has excellent color uniformity with respect to different viewing angle and good appearance at the time of not emitting light.

Means for Solving the Problem

The present invention [1] includes a sheet used for coating an optical semiconductor element. The sheet is used for directly or indirectly coating an optical semiconductor element, and includes a white layer containing white particles and a light diffusion layer containing light diffusion particles in this order in a thickness direction.

The present invention [2] includes a sheet used for coating the optical semiconductor element described in [1], in which a lightness L* in the thickness direction of the sheet is larger than 51.2 and less than 67.7.

The present invention [3] includes a sheet used for coating the optical semiconductor element described in [2], in which the lightness L* in the thickness direction of the sheet is larger than 55.7 and less than 66.6.

The present invention [4] includes a sheet used for coating the optical semiconductor element described in any one of [1] to [3], in which an emitting angle of the light diffusion layer is larger than 20° and less than 120°.

The present invention [5] includes a sheet used for coating the optical semiconductor element described in [4], in which the emitting angle of the light diffusion layer is larger than 40° and less than 120°.

The present invention [6] includes a sheet used for coating the optical semiconductor element described in any one of [1] to [5], in which a thickness of the white layer is larger than 30 m and less than 200 m.

The present invention [7] includes a sheet used for coating the optical semiconductor element described in any one of [1] to [6], in which a thickness of the light diffusion layer is more than 30 μm and less than 600 μm.

The present invention [8] includes a sheet used for coating the optical semiconductor element described in any one of [1] to [7], in which the light diffusion layer includes a B-stage resin.

The present invention [9] includes a sheet used for coating the optical semiconductor element described in [8], in which in the light diffusion layer, a curve indicating a relation between a temperature T and a shear storage modulus G', obtained by measuring a dynamic viscoelasticity under a condition of a frequency of 1 Hz and a temperature increasing rate of 20° C./minute, has a minimum value, the temperature T at the minimum value falls within a range of 40° C. or higher and 200° C. or lower, and the shear storage modulus G' at the minimum value falls within a range of larger than 1000 Pa and less than 90000 Pa.

Effects of the Invention

According to the sheet used for coating the optical semiconductor element of the present invention, by coating the sheet on the optical semiconductor element, a white layer containing white particles, and a light diffusion layer containing light diffusion particles can be arranged on the optical semiconductor element. Thus, a coated optical semiconductor element that has excellent color uniformity with respect to different viewing angle and good appearance at the time of not emitting light.

BRIEF DESCRIPTION OF THE DRAWINGS

FIGS. 2A to 2F are steps of manufacturing of an element covered by three layers according to an embodiment. FIG. 2A illustrates a step where an element is prepared; FIG. 2B illustrates a step where a sheet is prepared; FIG. 2C illustrates a step where the sheet is pressed to the element; FIG. 2D illustrates a step where a release sheet is peeled off; FIG. 2E illustrates a step where the element covered by three layers is cut; and FIG. 2F illustrates a step where an element covered by three layers is mounted on a board.

FIG. 3A is a top view, and FIG. 3B is a cross-sectional view along a line A-A of FIG. 3A.

FIG. 4A illustrates a step where a phosphor layer-coated element is prepared; FIG. 4B illustrates a step where a light diffusion layer is arranged on side portion of phosphor layer-coated element; FIG. 4C illustrates a step where a coating sheet is prepared; FIG. 4D illustrates a step where the coating sheet is pressed to the phosphor layer-coated element; FIG. 4E illustrates a step where a release sheet is peeled off; and FIG. 4F illustrates a step where the three-layer coated element is cut.

FIG. 5A is a plan view, and FIG. 5B is a cross-sectional view along a line A-A in FIG. 5A.

DETAILED DESCRIPTION OF THE PREFERRED EMBODIMENTS

Figure 1:
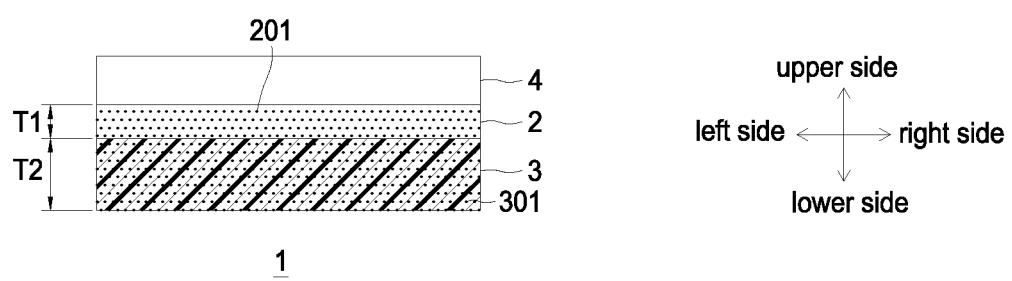
FIG. 1 is a cross-sectional view of a sheet in accordance with an embodiment of the present invention.

In FIG. 1, the vertical direction of the drawing is defined to be a vertical direction (first direction and thickness direction). The upper side of the drawing is defined to be an upper side (one side of the first direction and one side of the thickness direction). The lower side of the drawing is defined to be a lower side (another side of the first direction and another side of the thickness direction). The right and left direction of the drawing is defined to be a right and left direction (a second direction orthogonal to the first direction, and an example of a direction orthogonal to the vertical direction). The left side of the drawing is defined to be a left side (one side of the second direction), and the right side of the drawing is defined to be a right side (another side of the second direction). The direction into the page of the drawing is defined to be a forward-backward direction (a third direction orthogonal to the first direction and to the second direction, another example of a direction orthogonal to the vertical direction). The front side of the drawing is defined to be a front side (one side of the third direction), and the rear side of the drawing is defined to be a rear side (another side of the third direction). Specifically, the above is in accordance with the direction arrows illustrated in each drawing.

Embodiment

With reference to FIG. 1, a sheet used for coating an optical semiconductor element according to an embodiment of the present invention (hereinafter simply referred also to as a "coating sheet") will be described.

1. Coating Sheet

A coating sheet 1 is a sheet used for directly or indirectly coating an optical semiconductor element, and having an approximate plate (sheet) shape extending in a surface direction (directions orthogonal to the thickness direction, i.e. a forward-backward direction, and a left-right direction). The coating sheet 1 includes a white layer 2 and a light diffusion layer 3 in a thickness direction in this order. Preferably, the coating sheet 1 is only composed of the white layer 2 and the light diffusion layer 3.

Moreover, the coating sheet 1 is neither a three-layer coated element 5 (see FIGS. 2E and 3B), which will be described later, nor an optical semiconductor device 10 (see FIG. 2F). That is, the coating sheet 1 is a part of the three-layer coated element 5 and a part of the optical semiconductor device 10, and is a component for manufacturing the three-layer coated element 5 and the optical semiconductor device 10. Thus, the coating sheet 1 does not include an optical semiconductor element 6 and a substrate, on which the optical semiconductor element 6 is disposed (see FIG. 2F). The coating sheet 1 itself is a device which is distributed as a single component, and industrially applicable.

2. White Layer

A white layer 2 has an approximate plate (sheet) shape extending in a plane direction. The white layer 2 is a white layer that makes the appearance of the three-layer coated element 5 white at the time of non-light emission.

The white layer 2 contains white particles 201. Specifically, the white layer 2 is formed of, for example, a white resin composition containing white particles 201 and a first resin.

The white particles 201 include white inorganic particles or white organic particles. Preferably, from the viewpoint of heat dissipation and durability, white inorganic particles are used.

A material of the white inorganic particles includes an oxide, such as titanium oxide, zinc oxide, zirconium oxide, or aluminum oxide; a carbonate, such as lead white (basic lead carbonate) or calcium carbonate; or clay minerals such as kaolin. From the viewpoint of brightness and whiteness, the oxide is used, and more preferably titanium oxide is used.

An average particle diameter of the white particles 201 is, for example, larger than 0.1 m, and preferably larger than 0.2 μm. Moreover, the average particle diameter is, for example, less than 2.0 μm, and preferably less than 0.5 μm. When the average particle diameter of the white particles 201 falls within the above-described range, the whiteness can be further enhanced.

In the present invention, the average particle diameter of particles, such as white particles 201, light diffusion particles, fillers, and thixotropy-imparting particles, is calculated as a D50 value, and specifically, measured by using a laser diffraction type particle size distribution meter.

A content ratio of white particles 201 with respect to a white resin composition is, for example, larger than 1.0 mass %, preferably larger than 2.0 mass %, and more preferably larger than 2.5 mass %. Moreover, the content ratio is, for example, less than 9.0 mass %, preferably less than 7.0 mass %, and more preferably less than 6.0 mass %.

The first resin is a resin capable of forming a matrix in which white particles 201 can be dispersed. Such a first resin includes a thermosetting resin or a thermoplastic resin, and preferably, the thermosetting resin is used.

The thermosetting resin includes a two-stage reaction-curable resin and a one-stage reaction-curable resin.

The two-stage reaction-curable resin has two reaction mechanisms. In a reaction of a first stage, the resin is changed from an A-stage to a B-stage (semi-cured); and in a reaction of a second stage, the resin is changed from the B-stage to a C-stage (complete cure). That is, the two-stage reaction-curable resin is a thermosetting resin, in which the B-stage resin can be obtained under a proper heating condition. The B-stage is a state in which the thermosetting resin is between the A-stage that is a liquid state and the C-stage that is a completely cured state. The B-stage, in which curing and gelation slightly proceed, is a half-solid state or solid state with a compressive elastic modulus lower than that of the C-stage.

The one-stage reaction-curable resin has one reaction mechanism. In a reaction of a first stage, the resin can be changed from the A-stage to the C-stage (complete cure). Such a one-stage reaction-curable resin includes a thermosetting resin. In a middle of a reaction of the first stage, the reaction can be stopped and the resin can be changed from the A-stage to the B-stage, the reaction of the first stage is restarted by subsequent additional heating, and the resin is changed from the B-stage to the C-stage (completely cured). That is, the thermosetting resin is a one-stage reaction-curable resin that can be a B-stage resin. Moreover, the one-stage reaction-curable resin also can include a thermosetting resin, in which the reaction cannot be controlled to be stopped in the middle of the reaction of the first stage. That is, the resin cannot be changed from the A-stage to the B-stage, but can be changed to the C-stage (completely cured) at one time. That is, the thermosetting resin may be a one-stage reaction curable resin which cannot be a B-stage resin.

Preferably, the thermosetting resin includes a thermosetting resin (two-stage reaction-curable resin and one-stage reaction-curable resin) that can be a B-stage resin.

The thermosetting resin that can be a B-stage resin preferably includes a silicone resin and an epoxy resin, and more preferably includes a silicone resin.

The silicone resin that can be a B-stage resin includes thermoplastic and thermosetting silicone resin and non-thermoplastic and thermosetting silicone resin. The thermoplastic and thermosetting silicone resin has both a thermoplastic property and a thermosetting property. The non-thermoplastic and thermosetting silicone resin does not have a thermoplastic property but has a thermosetting property. Preferably, the silicone resin includes the thermoplastic and thermosetting silicone resin.

The thermoplastic and thermosetting silicone resin is once plasticized (or liquefied) by heating in the B-stage, and is cured (changed to the C-stage) by further heating. Specifically, the one-stage reaction-curable resin includes a phenyl-based silicone resin composition disclosed in Japanese Unexamined Patent Application Publication No. 2016-037562, or Japanese Unexamined Patent Application Publication No. 2016-119454. The two-stage reaction-curable resins include a first to sixth thermoplastic and thermosetting silicone resin composition (e.g. a silicone resin composition contains amino groups at both ends, or a composition contains cage octasilsesquioxane) disclosed in Japanese Unexamined Patent Application Publication No. 2014-72351 or Japanese Unexamined Patent Application Publication No. 2013-187227. Preferably, the thermoplastic and thermosetting silicone resin includes a phenyl-based silicone resin composition.

The phenyl-based silicone resin composition has a phenyl group at a main skeleton that is siloxane bonds. The phenyl-based silicone resin composition preferably includes an addition reaction-curable silicone resin composition. Specifically, the phenyl-based silicone resin includes an addition reaction-curable silicone resin composition, which contains an alkenyl group-containing polysiloxane, a hydrosilyl group-containing polysiloxane, and a hydrosilylation catalyst, and in which at least one of an alkenyl group-containing polysiloxane and a hydrosilyl group-containing polysiloxane has a phenyl group, or the like. Although the phenyl-based silicone resin composition softens (exhibits a minimum point) by the aforementioned further heating, the phenyl-based silicone resin composition is harder than a typical thermoplastic and thermosetting silicone resin.

The non-thermoplastic and thermosetting silicone resin can include a two-stage reaction-curable resin, for example, a first to eighth condensation and addition reaction-curable silicone resin composition disclosed in Japanese Unexamined Patent Application Publication No. 2010-265436, Japanese Unexamined Patent Application Publication No. 2013-187227, or the like.

Moreover, the thermosetting resin that cannot be the B-stage resin can include an addition reaction curing type silicone resin composition. The addition reaction curing type silicone resin composition which cannot be the B-stage resin can be a commercial product (for example, a product name: KER-2500, KER-6110, manufactured by Shin-Etsu Chemical Co. Ltd.; product name: LR-7665, manufactured by Asahi Kasei Co. Ltd.).

The addition reaction curing type silicone resin composition which cannot be the B-stage resin has substantially only a methyl group is provided at a main skeleton that is siloxane bonds. Note that such a silicone resin composition is a methyl-based silicone resin composition.

A refractive index of the first resin is, for example, larger than 1.30 and less than 1.75. In particular, the refractive index of the C-stage resin of the phenyl-based silicone resin composition is, for example, larger than 1.45, preferably larger than 1.50, and more preferably larger than 1.55. Moreover, the refractive index is, for example, less than 1.75, and preferably less than 1.65. Moreover, the refractive index of the methyl-based silicone resin composition is, for example, larger than 1.30, preferably larger than 1.35. The refractive index is, for example, less than 1.50. In the present invention, the refractive index is measured by using, for example, an Abbe refractometer.

The content ratio of the first resin with respect to the white resin composition is, for example, larger than 10 mass %, and preferably larger than 20 mass %. Moreover, the content ratio is, for example, less than 99 mass %, preferably less than 98 mass %, and more preferably less than 90 mass %.

The white resin composition can contain, in addition to the above-described components, particles such as thixotropy-imparting particles, fillers, or the like.

A thixotropy-imparting particle is a thixotropy agent that imparts thixotropy to the white resin composition, or enhances thixotropy of the white resin composition. Thixotropy is a property in which viscosity gradually decreases as shear stress is continuously applied, and the viscosity gradually increases under static conditions.

According to this property, the white particles 201 can be uniformly dispersed in the white resin composition (and the white layer 2), and thereby a uniform appearance (white) without color unevenness can be obtained at the time of non-light emission.

The thixotropy-imparting particles preferably can include, from the viewpoint of dispersibility, a nano-silica such as a fumed silica.

The fumed silica may be, for example, one of a hydrophobic fumed silica having a hydrophobic surface made by a surface treatment agent such as dimethyldichlorosilane or silicone oil, and a hydrophilic fumed silica which is not subjected to surface treatment.

An average particle diameter of the nano-silica (particularly fumed silica) is, for example, larger than 1 nm, and preferably larger than 5 nm. Moreover, the average particle diameter is, for example, less than 200 nm, and preferably less than 50 nm. Moreover, the specific surface area (BET method) of the nano-silica (especially fumed silica) is, for example, larger than 50 $m^2/g$, preferably larger than 200 $m^2/g$. Moreover, the specific surface area is, for example, less than 500 $m^2/g$.

When the white resin composition contains thixotropy-imparting particles, the content ratio of the thixotropy-imparting particles with respect to the white resin composition is, for example, larger than 0.1 mass %, and preferably larger than 0.5 mass %. Moreover, the content ratio is, for example, less than 10 mass %, and preferably less than 3 mass %.

The filler can be a transparent particle, and has a small refractive index difference between the first resin. Specifically, an absolute value of the refractive index difference between the filler and the first resin is, for example, less than 0.03, and preferably less than 0.01. Thus, a rigidity of the white layer 2 can be enhanced while securing the transparency of the white layer 2.

The filler may be the same as the filler described later for a light diffusion composition which will be described later. The filler preferably includes glass particles.

When the white resin composition contains a filler, a content ratio of the filler with respect to the white resin composition is, for example, larger than 5 mass %, and preferably larger than 10 mass %. Moreover, the content ratio is, for example, less than 80 mass %, and preferably less than 70 mass %.

The thickness T1 of the white layer 2 is, for example, larger than 30 μm, and preferably larger than 50 μm. Moreover, the thickness is, for example, less than 200 μm, and preferably less than 180 μm.

When the thickness of the white layer 2 is greater than or equal to the above-mentioned lower limit, the color of the phosphor layer 7 can be shielded sufficiently, and thereby the appearance at the time of non-light emission can be white. On the other hand, when the thickness of the white layer 2 is less than or equal to the aforementioned upper limit, a reflection from the white layer 2 is sufficiently suppressed to returning to the optical semiconductor element 6, and thereby a brightness of the optical semiconductor light-emitting device can be maintained.

3. Light Diffusion Layer

The light diffusion layer 3 has a like plate (sheet) shape extending along a surface direction. A light diffusion layer 3 is a diffusion layer for diffusing light emitted from the optical semiconductor element 6 (see FIG. 3B).

The light diffusion layer 3 with a thickness of 100 μm and is emitted by a light with a wavelength of 450 nm, and the light transmittance of the light diffusion layer 3 is, for example, larger than 30%, and preferably larger than 40%. Moreover, the light transmittance is, for example, less than 80%, and preferably less than 70%.

The light diffusion layer 3 contains light-diffusing particles 301. Specifically, the light diffusion layer 3 is formed of, for example, a light diffusion composition containing light-diffusing particles 301 and a second resin.

The light-diffusing particles 301 include transparent particles for diffusing light with a refractive index which has great difference from the refractive index of the second resin.

Specifically, the light-diffusing particles 301 include light-diffusing inorganic particles or light-diffusing organic particles.

The light-diffusing inorganic particles include silica particles or composite inorganic oxide particles.

The composite inorganic oxide particles are preferably glass particles. Specifically, the composite inorganic oxide particles can include silica or include silica and boron oxide as a main component, and can include aluminum oxide, calcium oxide, zinc oxide, strontium oxide, magnesium oxide, zirconium oxide, barium oxide, antimony oxide, or the like as a subcomponent. A content ratio of the main component with respect to the composite inorganic oxide particles is, for example, larger than 40 mass %, and preferably larger than 50 mass %. Moreover, the content ratio is, for example, less than 90 mass %, and preferably less than 80 mass %. A content ratio of the subcomponent with respect to the composite inorganic oxide particles is a remaining part of the content ratio of the main component described above.

Light-diffusing organic particles include acrylic resin particles, styrene-based resin particles, acrylic-styrene resin particles, silicone-based resin particles, polycarbonate-based resin particles, benzoguanamine-based resin particles, polyolefin-based resin particles, polyester resin particles, polyamide resin particles, or polyimide resin particles. Preferably, the light-diffusing organic particles can include acrylic resin particles and silicone resin particles, and more preferably include silicone resin particles.

From the viewpoint of light diffusion property and durability, the light-diffusing particles 301 preferably include light-diffusing inorganic particles, more preferably silica particles and glass particles, and further preferably silica particles.

The refractive index of the light-diffusing particles 301 is appropriately set according to the refractive index of the second resin. The refractive index is, for example, larger than 1.40, and preferably larger than 1.45. Moreover, the refractive index is, for example, less than 1.60, and preferably less than 1.55.

An absolute value of the refractive index difference between the light-diffusing particles 301 and the second resin is, for example, larger than 0.04, preferably larger than 0.05, and more preferably larger than 0.10. Moreover, the absolute value of the refractive index difference is, for example, less than 0.20, and preferably less than 0.18. When the refractive index difference is below the aforementioned lower limit, sufficient light diffusion property may not be exhibited. On the other hand, when the refractive index difference exceeds the aforementioned upper limit, light may be excessively diffused, and optical characteristics such as brightness may be degraded.

The average particle diameter of the light-diffusing particles 301 is, for example, larger than 1.0 μm, and preferably larger than 2.0 μm. Moreover, the average particle diameter is, for example, less than 10 μm, and preferably less than 5.0 μm.

The content ratio of the light-diffusing particles 301 with respect to the light diffusion composition is, for example, larger than 5 mass %, preferably larger than 10 mass %, and more preferably larger than 30 mass %. Moreover, the content ratio is, for example, dess than 60 mass %, preferably less than 50 mass %, and more preferably less than 40 mass %. Moreover, the content ratio of the main component of the light-diffusing particles with respect to the light diffusion composition is, for example, larger than 40 mass %, and preferably larger than 50 mass %. The content ratio is, for example, less than 90 mass %, and preferably less than 80 mass %.

The second resin is a transparent resin capable of making the light-diffusing particles 301 can be dispersed in with a matrix. The second resin can include the same resin as the first resin. Preferably, the second resin include a curable resin, more preferably include a thermosetting resin which can be the B-stage resin, further preferably include a thermoplastic and thermosetting silicone resin, and particularly preferably include a phenyl-based silicone resin composition.

The content ratio of the second resin with respect to the light diffusion composition is, for example, larger than 10 mass %, and preferably larger than 20 mass %. The content ratio is, for example, less than 90 mass %, preferably less than 80 mass %, and more preferably less than 60 mass %.

The light diffusion composition may include, in addition to the aforementioned component, particles such as thixotropy-imparting particles or fillers.

The thixotropy-imparting particles can include the same thixotropy-imparting particles of the white resin composition described above. Preferably, the thixotropy-imparting particles include fumed silica.

When the light diffusion composition contains thixotropy-imparting particle, a content ratio of the thixotropy-imparting particles with respect to the light diffusion composition is, for example, larger than 0.1 mass %, and preferably larger than 0.5 mass %. The content ratio is, for example, less than 10 mass %, and preferably less than 3 mass %.

The filler can be transparent particles, and has a small refractive index difference between the second resin. Specifically, an absolute value of the refractive index difference between the filler and the second resin is, for example, less than 0.03, and preferably less than 0.01. Thus, it can enhance the rigidity of the light diffusion layer 3 while securing the transparency of the light diffusion layer 3.

The refractive index of the filler is appropriately set according to the refractive index of the second resin, and is, for example, preferably larger than 1.40, and preferably larger than 1.45. The refractive index is, for example, less than 1.60, and preferably less than 1.55.

The fillers can include inorganic particles or organic particles. Preferably, the fillers can include inorganic particles.

The inorganic particles can include particles which have the same material as that of the light-diffusing particles, and preferably include composite inorganic oxide particles, such as glass particles.

The inorganic particles can include particles which have the same material as that of the light-diffusing particles 301, and preferably include composite inorganic oxide particles, such as glass particles.

The average particle diameter of the filler is, for example, larger than 1.0 μm, and preferably larger than 5.0 μm. Moreover, the average particle diameter is, for example, less than 100 μm, and preferably less than 50 μm.

When the filler is contained, the content ratio of the filler with respect to the light diffusion composition is, for example, larger than 5 mass %, and preferably larger than 10 mass %. Moreover, the content ratio is, for example, less than 50 mass %, and preferably less than 30 mass %.

Note that the particles used in the present invention can be distinguished into the light-diffusing particles 301 or the filler are properly according to the refractive index difference from the resin, even if the materials are the same, they are properly distinguished.

The thickness T2 of the light diffusion layer 3 is, for example, larger than 30 μm, preferably larger than 50 μm, and more preferably larger than 100 μm. Moreover, the thickness T2 is, for example, less than 600 μm, preferably less than 500 μm, and more preferably less than 200 μm.

When the thickness of the light diffusion layer 3 is larger than the aforementioned lower limit, light can be definitely diffused, and color uniformity in different viewing angle can be further enhanced. On the other hand, when the thickness of the white layer 2 is less than the aforementioned upper limit, it is possible to have a good appearance at the time of non-light emission with less reduction of the optical characteristics.

The emitting angle $\alpha$ of the light diffusion layer 3 is, for example, larger than 20°, preferably larger than 40°, more preferably larger than 80°, and further preferably larger than 100°. Moreover, the emitting angle $\alpha$ is, for example, less than 180°, preferably less than 150°, and more preferably less than 120°. When the emitting angle is larger than the aforementioned lower limit, light can be definitely diffused, and the color uniformity in different viewing angle can be further enhanced. The measurement method of the emitting angle will be described in detail in the embodiment.

4. Method for Manufacturing Coating Sheet

The coating sheet 1 can be manufactured by a white layer formation step which is forming a white layer 2 on a surface (lower surface in FIG. 1) of the release sheet 4, and a light diffusion layer formation step which is forming a light diffusion layer 3 on another surface (lower surface in FIG. 1) of the white layer 2.

(White Layer Formation Step)

In order to form a white layer 2, for example, a white resin composition (varnish) is prepared. Specifically, the white resin composition (varnish) is prepared by providing white particles 201, a first resin, and particles other than white particles 201, such as fillers or thixotropy-imparting particles, as necessary, and mixing thereof.

Subsequently, the white resin composition is applied to the surface of the release sheet 4 and cured.

The release sheet 4 is configured of, for example, a flexible film extending in a plane direction. The release sheet 4 can include a polymer film such as a polyethylene film or a polyester film, for example, a ceramic sheet, or a metal foil. A contacting surface, that is a surface to which the white resin composition is applied, of the release sheet 4 is subjected to a release treatment such as a fluorine treatment, as necessary. A thickness of the release sheet 4 is, for example, larger than 1 μm, and preferably larger than 10 μm. Moreover, the thickness is, for example, less than 2000 μm, and preferably less than 1000 μm.

Next, when the white resin composition contains a thermosetting resin, the white resin composition can be changed to the C-stage. Specifically, the white resin composition in the A-stage is heated (baked) to be changed to the C-stage.

The heating (bake) condition is properly determined according to a type of the white resin composition. The heating temperature is, for example, larger than 100° C., and preferably larger than 110° C. Moreover, the temperature is, for example, less than 150° C., and preferably less than 130° C. The heating time is, for example, larger than 5 minutes, and preferably larger than 10 minutes. Moreover, the heating time is, for example, less than 480 minutes, and preferably less than 300 minutes. Note that the heating process may be performed a plurality of times at different temperatures.

According to the aforementioned processes, the white layer 2 is formed on the surface of the release sheet 4. Specifically, a white layer 2 in the C-stage is formed.

(Light Diffusion Layer Formation Step)

In order to form the light diffusion layer 3, for example, a light diffusion layer composition (varnish) is prepared. Specifically, the light diffusion layer composition (varnish) is prepared by providing light-diffusing particles 301, a second resin, and particles other than the light-diffusing particles 301, such as fillers or thixotropy-imparting particles, as necessary, and mixing thereof.

Then, the light diffusion layer composition is applied to the surface of the white layer 2, and cured.

Then, when the light diffusion layer composition contains a thermosetting resin, the light diffusion layer composition can be changed to the B-stage. Specifically, the light diffusion layer composition in the A-stage is heated (baked) to be changed to the B-stage.

The heating (bake) condition is properly determined according to the type of the light diffusion layer composition. The heating temperature is, for example, larger than 50° C., and preferably larger than 70° C. The temperature is, for example, less than 100° C. and preferably less than 90° C. The heating time is, for example, larger than one minute, and preferably larger than 5 minutes. Moreover, the heating time is less than 30 minutes, and preferably less than 20 minutes.

Thus, the light diffusion layer 3 is formed (arranged) on the surface of the white layer 2. Specifically, the light diffusion layer 3 in the B-stage is formed. That is, the resin contained in the light diffusion layer 3 is the B-stage resin.

As a result, a coating sheet 1 supported by the release sheet 4 and including the white layer 2 and the light diffusion layer 3 is obtained.

Lightness L* in a thickness direction of the coating sheet 1 is, for example, larger than 51.2, preferably larger than 55.7, and more preferably larger than 60.0. Moreover, the lightness is, for example, less than 67.7, more preferably less than 66.6, and more preferably less than 62.5. The lightness of the coating sheet 1 is substantially the same, regardless of the state of the contained resin (B-stage or C-stage). The lightness is measured by using an ultraviolet-visible near infrared spectrophotometer, and is measured by using a transmittance measuring method in an integrating sphere. The details are described later in the embodiment.

When the lightness is larger than the above-mentioned lower limit, a total light flux of light emitted from the three-layer coated element 5 becomes excellent, and thereby the three-layer coated element 5 has excellent brightness. On the other hand, when the brightness is less than the aforementioned upper limit, color of the phosphor layer 7 is definitely shielded, and thereby the appearance at the time of non-light emission can be further whiter.

A thickness of the coating sheet 1 is, for example, larger than 50 μm, and preferably larger than 150 μm. Moreover, the thickness is, for example, less than 1000 μm, and preferably less than 500 μm.

5. Method for Manufacturing Three-Layer Coated Element

Next, with reference to FIGS. 2A to 2F, a method of coating the optical semiconductor element 6 with the coating sheet 1 will be described. Specifically, a method of manufacturing a three-layer coated element 5 by coating a phosphor layer-coated element 8 with the coating sheet 1 will be described.

The method for manufacturing the three-layer coated element 5 includes, for example, a preparation step which is preparing a phosphor layer-coated element assembly 11; a pressing step which is hot pressing the coating sheet 1 on the phosphor layer-coated element assembly 11; a peeling step which is separating a release sheet; and a cutting step which is cutting a three-layer coated element assembly 12.

(Preparation Step)

In the preparation step, as illustrated in FIG. 2A, a phosphor layer-coated element assembly 11 is prepared.

The phosphor layer-coated element assembly 11 includes a plurality of phosphor layer-coated elements 8; and a temporary fixing sheet 30 for temporarily fixing the plurality of phosphor layer-coated elements 8.

The phosphor layer-coated element 8 includes an optical semiconductor element 6 and a phosphor layer 7 covering the optical semiconductor element 6.

The optical semiconductor element 6 is, for example, an LED (light-emitting diode element) or LD (semiconductor laser element) for converting an electric energy into a light energy. Preferably, the optical semiconductor element 6 is a blue LED that emits blue light. The optical semiconductor element 6 does not include a rectifier (semiconductor element) such as a transistor which has different technical filed from that of the optical semiconductor element 6.

The optical semiconductor element 6 has a substantially planar shape along the surface direction. The optical semiconductor element 6 has a substantially rectangular shape in a plan view (preferably a substantially square shape in a plan view). The optical semiconductor element 6 includes an upper surface 21, a lower surface 22, and a side surface 23 (See FIG. 3B).

The upper surface 21 is a light-emitting surface for emitting light upward, and is a flat shape. A phosphor layer 7 (described later) is provided on the upper surface 21.

The lower surface 22 is a surface on which electrodes 24 are formed, is opposite to the upper surface 21, and with a space therebelow. A plurality (two) of electrodes 24 are provided on the lower surface 22, and have shapes slightly projecting downward from the lower surface 22.

The side surface 23 is a light-emitting surface for emitting light, and connects a peripheral edge of the upper surface 21 and a peripheral edge of the lower surface 22. The side surface 23 has four surfaces, i.e. a front surface 23a, a rear surface 23b, a left surface 23c, and a right surface 23d (refer to FIG. 3A).

The optical semiconductor element 6 emits light in five directions (i.e. toward the upper side, the front side, and the rear side, the left side and the right side) from at least five surfaces (i.e. upper surface 21 and side surfaces 23).

The dimensions of the optical semiconductor element 6 can be appropriately determined. Specifically, a thickness (length in the vertical direction) is, for example, larger than 0.1 μm, preferably larger than 10 μm, and more preferably larger than 100 μm. Moreover, the thickness is, for example, less than 2000 μm, preferably, less than 1500 μm, and more preferably less than 500 μm. Each of lengths of the optical semiconductor element 6 in surface directions (right and left direction and/or forward and backward direction) is, for example, larger than 200 μm, and preferably larger than 500 μm. Moreover, each of the lengths is, for example, less than 3000 μm, and preferably less than 2000 μm.

The phosphor layer 7 contains a phosphor, and converts a wavelength of light emitted from the optical semiconductor element 6. The phosphor layer 7 is arranged on the upper side and the side part of the optical semiconductor element 6 so as to cover the upper surface 21 and the side surfaces

23 (front surface 23a, rear surface 23b, left surface 23c, and right surface 23d) of the optical semiconductor element 6. That is, the phosphor layer 7 is arranged on the upper side and the periphery of the optical semiconductor element 6 so as to completely cover the five surfaces other than the lower surface of the optical semiconductor element 6. The phosphor layer 7 has a substantially rectangular shape in a plan view (preferably a substantially square shape in a plan view)), and covers the optical semiconductor element 6 in a direction projected in the vertical direction.

The phosphor can include, for example, a yellow phosphor capable of converting blue light into yellow light, and a red phosphor capable of converting blue light into red light. Preferably, for example, a yellow phosphor.

The yellow phosphor include, for example, a silicate phosphor, such as $(Ba,Sr,Ca)_2SiO_4$:Eu, or $(Sr,Ba)_2SiO_4$:Eu (barium orthosilicate (BOS)); for example, a garnet-type phosphor having a garnet-type crystal structure such as, $Y_3Al_5O_{12}$:Ce (YAG (yttrium-.aluminum-.garnet):Ce), or $Tb_3Al_3O_{12}$:Ce (TAG (terbium-.aluminum-.garnet):Ce); or for example, an oxynitride phosphor such as Ca-α-SiAlON.

A length in the vertical direction L1 (thickness: See FIG. 3B) of the phosphor layer 7 arranged on the upper side of the optical semiconductor element 6 is, for example, larger than 10 μm, preferably larger than 50 μm, and more preferably larger than 100 μm. Moreover, the length is, for example, less than 500 μm, preferably less than 400 μm, and more preferably less than 300 μm.

The temporary fixing sheet 30 includes a support base material 31; and a pressure-sensitive adhesive layer 32 arranged on the support base material 31.

The support base material 31 includes, for example, a polymer film, such as a polyethylene film, or a polyester film (PET or the like); for example, a ceramic sheet; or for example, a flexible sheet such as a metal foil.

The pressure sensitive adhesive layer 32 is disposed on the entire upper surface of the support base material 31. The pressure-sensitive adhesive layer 32 has a sheet shape on the upper surface of the support base material 31. A pressure-sensitive adhesive layer 32 is formed of, for example, a pressure sensitive adhesive, which reduces the pressure sensitive adhesive force by a treatment (for example, emitting with ultraviolet rays, heating, etc.). A thickness of the pressure-sensitive adhesive layer 32 is, for example, larger than 1 μm, and preferably larger than 10 μm. Moreover, the thickness is, for example, less than 1000 μm, and preferably less than 500 μm.

In the phosphor layer-coated element assembly 11, the plurality of phosphor layer-coated elements 8 are arranged in sequence on the temporary fixing sheet 30 and spaced apart from each other, so that the lower surface 22 of the phosphor layer-coated element 8 adheres to the upper surface of the pressure sensitive adhesive layer 32. At this time, the plurality of electrodes 24 is embedded in the pressure-sensitive adhesive layer 32.

The method of preparing the phosphor layer-coated element assembly 11 can be referred to the method described in Japanese Unexamined Patent Application Publication No. 2014-168036, Japanese Unexamined Patent Application Publication No 2016-119454 and the like.

(Pressing Step)

In the pressing step, as illustrated in FIGS. 2B and 2C, a coating sheet 1 is heat-pressed onto the phosphor layer-coated element assembly 11.

First, a hot pressing machine 43 having a lower plate 41 and an upper plate 42 is provided. The upper plate 42 is arranged above the lower plate 41 and faces the lower plate by an interval. The upper plate 42 can be moved to the upper surface of the lower plate 41 at the time of pressing. A heating device (not shown) is provided on the lower plate 41 and on the upper plate 42 so as to heat them to achieve a predetermined temperature.

Subsequently, as illustrated in FIG. 2B, a phosphor layer-coated element assembly 11 and the coating sheet 1 are arranged on the hot pressing machine 43. Specifically, the phosphor layer-coated element assembly 11 is arranged on an upper surface of the lower plate 41. Moreover, the coating sheet 1 is fixed on the lower surface of the upper plate 42 so that the light diffusion layer 3 is a lower side.

Then, as illustrated in FIG. 2C, the upper plate 42 is moved downward and the coating sheet 1 is pressed against the phosphor layer-coated element assembly 11. At this time, the lower plate 41 and the upper plate 42 are heated by the heating device.

The heating temperature is, for example, higher than 40° C., and preferably higher than 45° C. Moreover, the temperature is, for example, lower than 200° C., and preferably lower than 150° C.

The pressing pressure is, for example, larger than 0.01 MPa, and preferably larger than 0.1 MPa. Moreover, the pressing pressure is, for example, less than 10 MPa, and preferably less than 5 MPa.

The pressing time is, for example, larger than 1 second, and preferably larger than 10 seconds. Moreover, the pressing time is, for example, less than 30 minutes, and preferably less than 10 minutes.

Thus, the phosphor layer-coated element 8 is embedded in the light diffusion layer 3. Specifically, the upper surface and the side surfaces of the phosphor layer-coated element 8 are covered by the light diffusion layer 3, and an exposed surface of the temporary fixing sheet 30 (upper surface part exposed from the phosphor layer-coated element 8) is covered by the light diffusion layer 3.

As a result, the three-layer coated element assembly 12 along with the release sheet 4 including the temporary fixing sheet 30, the plurality of optical semiconductor elements 6, the phosphor layer 7, the light diffusion layer 3, and the white layer 2 is obtained.

(Peeling Step)

In the peeling step, as illustrated in a virtual line in FIG. 2D, the release sheet 4 is peeled off from the three-layer coated element assembly 12. That is, the release sheet 4 is peeled off from the white layer 2.

Subsequently, when the light diffusion layer 3 is in the B-stage, the thermosetting resin is completely cured (state of the C-stage). Specifically, the three-layer coated element assembly 12 is heated by, for example, an oven.

The heating temperature is, for example, higher than 100° C., and preferably higher than 120° C. Moreover, the heating temperature is, for example, less than 200° C., and preferably less than 160° C. The heating time is, for example, larger than 10 minutes, and preferably larger than 30 minutes. Moreover, the heating time is, for example, less than 480 minutes, and preferably less than 300 minutes. Note that the heating may be performed in a plurality of times at different temperatures.

When using a phenyl-based silicone resin composition as the resin, a product of the C-stage has a content ratio of the phenyl group in the hydrocarbon groups directly bonded to a silicon atom. The content ratio is, for example, larger than 30 mol %, and preferably larger than 35 mol %. Moreover, the content ratio is, for example, less than 55 mol %, and preferably less than 50 mol %. The content ratio of the phenyl group is calculated by the $^{29}$Si-NMR. Details of the method for calculating the content ratio of phenyl groups are described in, for example, WO 2011/125463.

(Cutting Step)

In the cutting step, as illustrated in FIG. 2E, the three-layer coated element assembly 12 is cut (segmented).

Specifically, as shown by a dotted line in FIG. 2D, between the adjacent optical semiconductor elements 6, the white layer 2 and the light diffusion layer 3 are completely cut in the thickness direction. Thus, the three-layer coated element assembly 12 and phosphor layer-coated element 8 are divided into individual pieces. The white layer 2 and the light diffusion layer 3 are divided into individual pieces so that each piece corresponds to one phosphor layer-coated element 8.

In order to cut the white layer 2 and the light diffusion layer 3, for example, a dicing device using a narrow disk-shaped dicing saw, for example, a dicing device used by a cutter, or, for example, a dicing device used by a laser emitting device.

Subsequently, as shown by a virtual line in FIG. 2E, the temporary fixing sheet 30 is peeled off from the optical semiconductor element 6.

In this way, the three-layer coated element 5 including the optical semiconductor element 6, the phosphor layer 7, the light diffusion layer 3, and the white layer 2 is obtained.

Figure 3A:
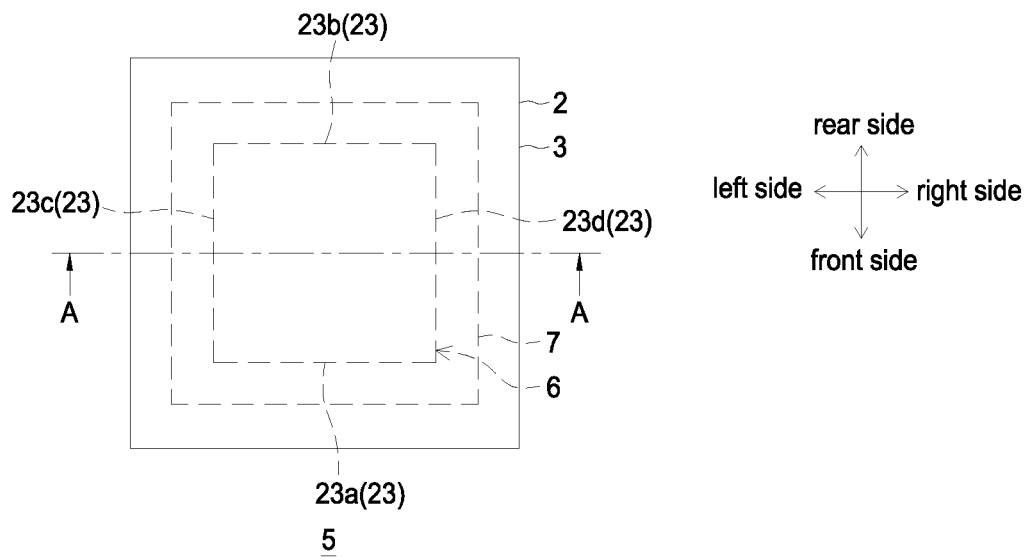
FIG. 3A and FIG. 3B are diagrams depicting the three-layer coated element prepared by the manufacturing method of FIGS. 2A to 2F.
Figure 3B:
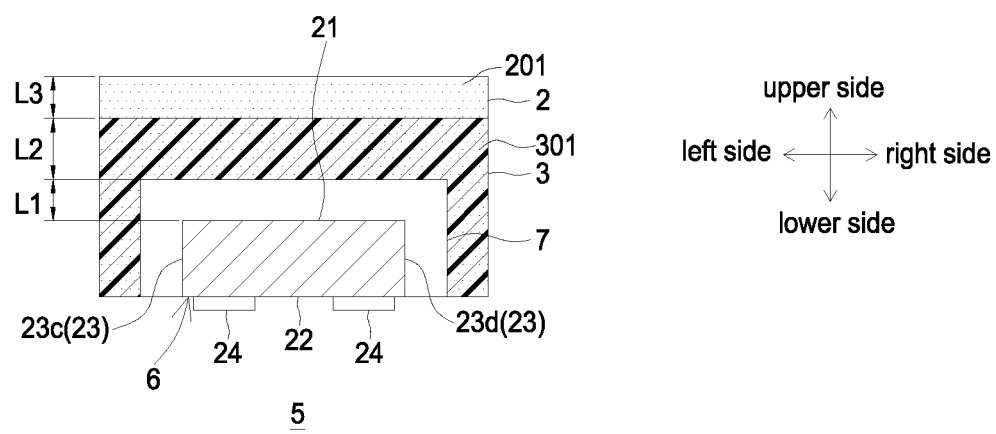

As illustrated in FIGS. 3A and 3B, in the three-layer coated element 5, the light diffusion layer 3 is arranged on the upper side and the lateral side of the phosphor layer 7 so as to cover the upper surface and the side surface of the phosphor layer 7. That is, the light diffusion layer 3 is arranged on the upper side and the periphery of the phosphor layer 7 so as to completely cover five surfaces other than the lower surface of the phosphor layer 7. The phosphor layer 7 has a substantially rectangular shape in a plan view (preferably a substantially square shape in a plan view), and covers the phosphor layer 7 in a direction projected in the vertical direction.

The vertical length L2 (thickness) of the light diffusion layer 3 disposed on the upper side of the phosphor layer 7 is, for example, larger than 30 μm, preferably larger than 50 μm, and more preferably larger than 100 μm. Moreover, the vertical length L2 is, for example, less than 600 μm, preferably less than 500 μm, and more preferably less than 200 μm.

The white layer 2 is arranged on the upper side of the light diffusion layer 3 so as to cover the upper surface of the light diffusion layer 3. That is, the white layer 2 is arranged on the upper side of the light diffusion layer 3 so as to completely cover only the upper surface of the light diffusion layer 3. The white layer 2 has a substantially rectangular shape in a plan view (preferably a substantially square shape in a plan view), and has a coincide shape with the light diffusion layer 3 in a direction projected in the vertical direction.

The vertical length L3 (thickness) of the white layer 2 is, for example, larger than 30 μm, and preferably larger than 50 μm. Moreover, the vertical length L3 is, for example, less than 200 μm, and preferably less than 180 μm.

The three-layer coated element 5 is not the optical semiconductor device 10 (see FIG. 2F), that is, does not include the substrate 15 of the optical semiconductor device 10. In other words, the electrode 24 of the three-layer coated element 5 is configured to not electrically connect to a terminal (not shown) of the substrate 15 of the optical semiconductor device 10. Moreover, the three-layer coated element 5 is a part of the optical semiconductor device 10, that is, a part for manufacturing the optical semiconductor device 10, and the three-layer coated element 5 itself is a single component for industrial application.

As illustrated in FIG. 2F, when the three-layer coated element 5 is flip-disposed on the substrate 15, such as a diode substrate, an optical semiconductor device 10 such as a light-emitting diode device is obtained.

The substrate 15 has a substantially planar shape, and specifically, is formed of a laminated plate, in which a conductor layer is laminated as a circuit pattern on an upper surface of an insulating substrate. The insulating substrate can include a silicon substrate, a ceramic substrate, or a plastic substrate (for example, a polyimide resin substrate). The conductor layer is formed of, for example, a conductor such as gold, copper, silver, or nickel. The conductor layer includes an electrode (not shown) used for electrically connecting with a single optical semiconductor element 6. The thickness of the substrate 15 is, for example, larger than 25 μm, and preferably larger than 50 μm. The thickness is, for example, less than 2000 μm, and preferably less than 1000 μm.

<Action and Effect>

Because the coating sheet 1 includes the white layer 2 containing white particles 201, and the light diffusion layer 3 containing light-diffusing particles 301 in the thickness direction in this order, the white layer 2 containing white particles 201, and the light diffusion layer 3 containing the light-diffusing particles 301 can be arranged on the phosphor layer-coated element 8.

In particular, the light diffusion layer 3 can be arranged on the upper side and the lateral side of the phosphor layer-coated element 8. Thus, white light emitted from the phosphor layer-coated element 8 can be definitely diffused by the light diffusion layer 3, and color unevenness in a front direction and an oblique direction can be reduced. That is, color uniformity in different viewing angle is excellent. As a result, when the white light emitted from the three-layer coated element 5, a yellow ring or the like caused by color unevenness can be reduced.

Moreover, the white layer 2 can be disposed on the outermost surface of the three-layer coated element 5. Thus, at the time of non-light emission (furthermore, also at the time of light emission), the three-layer coated element 5 has a white appearance. As a result, the appearance of design is excellent.

Moreover, because the coating sheet 1 can be arranged on the phosphor layer-coated elements 8 by the hot pressing, a three-layer coated element 5, which is excellent in color uniformity with respect to angular directions, and an appearance (whiteness) at the time of non-light emission, can be easily manufactured.

<Variation>

In the following variation, the same reference numeral is assigned to the same component as in the embodiment illustrated in FIGS. 1 to 3B, and detailed explanation will be omitted.

(1) In the manufacturing method of the three-layer coated element 5 illustrated in FIGS. 2A to 2F, the coating sheet 1 is arranged on the phosphor layer-coated element 8, so that the light diffusion layer 3 covers the upper surface and the side surface of the phosphor layer 7. And also, for example, as illustrated in FIGS. 4A to 4F, the coating sheet 1 may be arranged on the phosphor layer-coated element 8 so that the light diffusion layer 3 only covers the upper surface of the phosphor layer 7.

In the embodiment illustrated in FIGS. 4A to 4F, preferably, the light diffusion layer 3 of the coating sheet 1 is the B-stage, and the hardness of the light diffusion layer 3 is slightly harder than that of the light diffusion layer 3 used in FIGS. 2A to 2F.

Specifically, all of the following conditions [1] to [3] are satisfied:

[1] A curve indicating a relation between a temperature T and a shear storage modulus G', obtained by measuring a dynamic viscoelasticity under a condition of a frequency of 1 Hz and a temperature increasing rate of 20° C./minute, has a minimum value.

[2] The temperature T at the minimum value falls within a range of higher than 40° C. and lower than 200° C.

[3] The shear storage modulus G' at the minimum value falls within a range of larger than 1000 Pa and less than 90000 Pa. The shear storage modulus preferably falls within a range of larger than 10000 Pa, more preferably larger than 20000 Pa, further preferably larger than 30000 Pa. Moreover, the shear storage modulus G' is preferably less than 70000 Pa.

When the light diffusion layer 3 satisfies the aforementioned conditions, the thickness of the light diffusion layer 3 can be maintained before pressing and after pressing, and the light diffusion layer 3 is capable of adhering to the phosphor layer-coated element 8 with an excellent adhesion force. Moreover, the thickness of the light diffusion layer 3 adhering to the phosphor layer-coated element 8 can be made more definitely uniform.

Note that in order to manufacture the coating sheet 1 having the light diffusion layer 3 satisfying the aforementioned conditions, for example, a phenyl-based silicone resin composition is used for the second resin. When the light diffusion layer 3 is in the B-stage, the hardening level of the light diffusion layer 3 is larger than that of the light diffusion layer 3 of the coating sheet 1 used in the embodiment as illustrated in FIGS. 2A to 2F. That is, the heating extent is strengthened.

Specifically, the heating temperature is, for example, higher than 70° C., and preferably higher than 80° C. Moreover, the heating temperature is, for example, less than 150° C., and preferably less than 140° C. The heating time is, for example, longer than 10 minutes, preferably larger than 12 minutes, and more preferably larger than 15 minutes. The heating time is, for example, less than 60 minutes, and preferably less than 50 minutes.

Note that, the light diffusion layer 3 of the coating sheet 1 in the embodiment illustrated in FIGS. 2A to 2F has the shear storage modulus G' at the minimum value, in the condition [3], for example, less than 1000 Pa, and preferably less than 500 Pa. Moreover, the shear storage modulus G' is, for example, larger than 10 Pa.

Next, a method of manufacture the three-layer coated element 5 by coating the phosphor layer-coated element 8 with the coating sheet 1 will be described in the embodiment illustrated in FIGS. 4A to 4F.

The method of manufacturing the three-layer coated element 5 includes, for example, a preparation step which a phosphor layer-coated element assembly 11 is provided; a light diffusion layer arrangement step which a light diffusion layer side part 13 is arranged in the phosphor layer-coated element assembly 11; a pressing step which the coating sheet 1 is heat-pressed on the phosphor layer-coated element assembly 11 including the light diffusion layer side part 13; a peeling step which a release sheet is separated; and a cutting step which a three-layer coated element assembly 12 is cut.

Figure 4A:
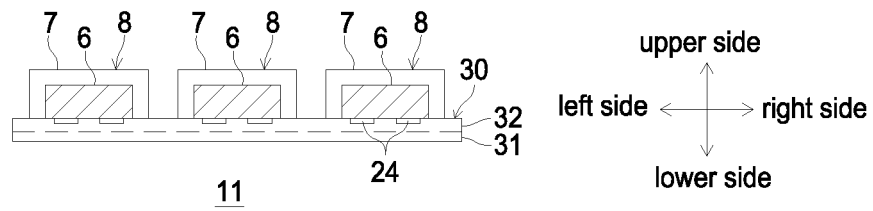
FIGS. 4A to 4F are steps of a manufacturing method of a three-layer coated element according to another embodiment (which a light diffusion layer is only arranged on an upper surface of the phosphor layer-coated element).

The illustration of the preparation step shown in FIG. 4A is the same as that in FIG. 2A.

Figure 4B:
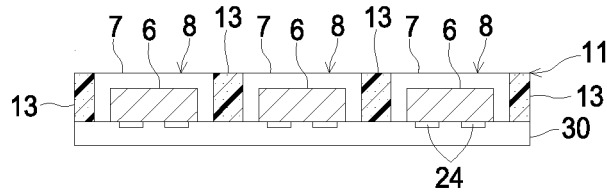

The arrangement step of the light diffusion layer is shown in FIG. 4B, the light diffusion layer side part 13 is arranged in the phosphor layer-coated element assembly 11. Specifically, before the pressing step, in the phosphor layer-coated element assembly 11, the light diffusion layer side part 13 is arranged between the plurality of phosphor layer-coated elements 8.

In order to arrange the light diffusion layer side portion 13, for example, a light diffusion composition is filled between the plurality of phosphor layer-coated element 8. Subsequently, when the light diffusion composition contains a thermosetting resin, the light diffusion composition is changed to the B-stage by heating or the like. Alternatively, a hot press may be applied to the phosphor layer-coated element assembly 11 is heat-pressed by using a transfer sheet of the light diffusion layer side part that includes the light diffusion layer side part 13 with the B-stage and a release sheet.

At this time, an upper surface of the light diffusion layer side part 13 and an upper surface of the phosphor layer 7 are coplanar. The upper surface of the light diffusion layer side part 13 and/or that of the phosphor layer 7 is/are polished as necessary.

Figure 4C:
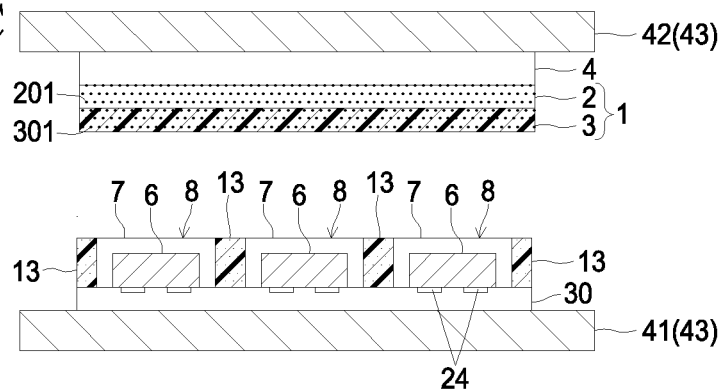
Figure 4D:
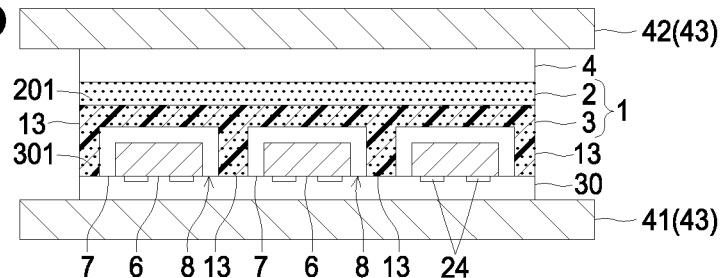

In the pressing step, as illustrated in FIGS. 4C to 4D, the coating sheet 1 is hot-pressed on the phosphor layer-coated element assembly 11 which includes the light diffusion layer side part 13. The conditions of the hot pressing are the same as in that illustrated in FIGS. 2B to 2C.

Thus, the light diffusion layer 3 is arranged on the upper surfaces of the phosphor layer 7 and the light diffusion layer side part 13, so as to cover the upper surfaces of the phosphor layer 7 and the light diffusion layer side part 13.

As a result, the three-layer coated element assembly 12 which is a lamination with the release sheet 4 includes the temporary fixing sheet 30, the plurality of optical semiconductor elements 6, the phosphor layer 7, the light diffusion layer side part 13, the light diffusion layer 3, and the white layer 2. At this time, the light diffusion layer side part 13 of the phosphor layer-coated element assembly 11 and the light diffusion layer 3 of the coating sheet 1 are integrated and form one light diffusion layer.

Figure 4E:
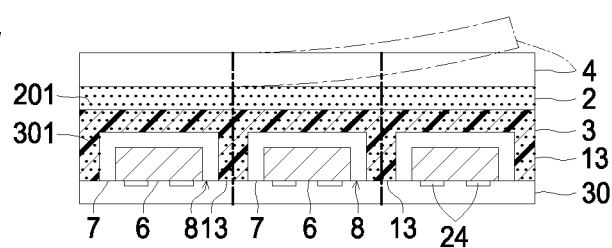

In the peeling step, as illustrated in a virtual line in FIG. 4E, the release sheet 4 is peeled off from the phosphor layer-coated element assembly 11. That is, the release sheet 4 is peeled off from the white layer 2 and from the light diffusion layer side part 13.

Subsequently, when the light diffusion layer 3 and/or the light diffusion layer side part 13 is in the B-stage, the thermosetting resin is completely cured (state of the C-stage). Specifically, the three-layer coated element assembly 12 is heated by, for example, an oven. The heating condition is the same as the heating condition illustrated in FIG. 2E.

Figure 4F:
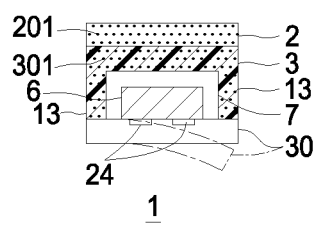

In the cutting step, as illustrated in FIG. 4F, the three-layer coated element assembly 12 is cut (segmented).

Specifically, as shown in a dotted line in FIG. 4E, the white layer 2, the light diffusion layer 3, and the light diffusion layer side part 13 which are disposed between the adjacent optical semiconductor elements 6 are completely cut in the thickness direction. Thus, for each phosphor layer-coated element 8, the three-layer coated element assembly 12 is divided into individual pieces.

The cutting method is the same as the cutting step illustrated in FIG. 2E.

In this way, the three-layer coated element 5 including the optical semiconductor element 6, the phosphor layer 7, the light diffusion layer 3, the white layer 2, and the light diffusion layer side part 13 is obtained.

The manufacturing method according to the embodiment illustrated in FIGS. 4A to 4F also provides the same effects as those of the manufacturing method according to the embodiment illustrated in FIGS. 2A to 2F. In particular, the three-layer coated element 5 manufactured by a method according to the second embodiment, the thickness L2 of the light diffusion layer 3 arranged on the upper surface of the phosphor layer 7 can be the same as the thickness of the light diffusion layer 3 of the coating sheet 1. Thus, the thickness of the light diffusion layer 3 can be easily designed.

(2) The embodiment shown in the aforementioned item (1) (FIGS. 4A to 4F), the light diffusion layer side part 13 is arranged in the phosphor layer coated-element assembly 11. However, another embodiment can be referred to FIGS. 5A to 5B, the coating sheet 1 can be hot-pressed on the phosphor layer-coated element assembly 11 without arranging the light diffusion layer side part 13.

At this time, the light diffusion layer 3 of the coating sheet 1 contacts the upper surface of the temporarily fixing sheet 30 (exposed surface) and is hot-pressed by a metal mold or the like.

Figure 5A:
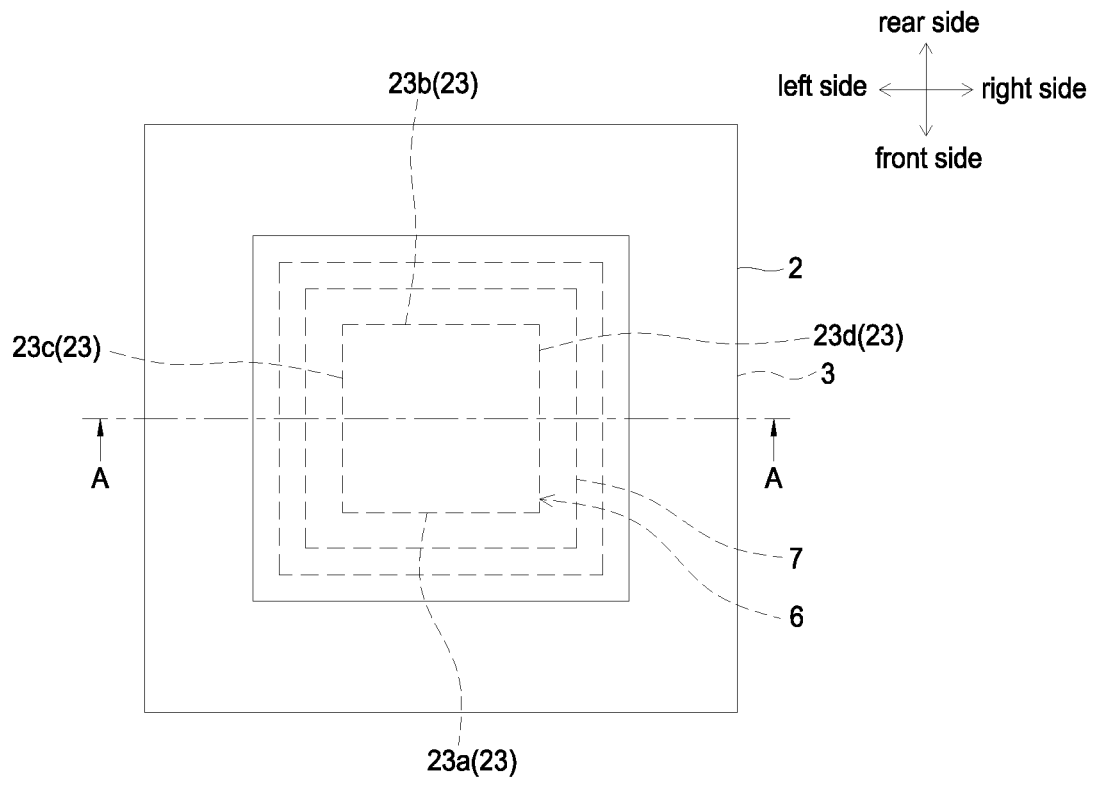
FIG. 5A and FIG. 5B are diagrams of another embodiment of the three-layer coated element prepared by the manufacturing method according to FIGS. 4A to 4F (embodiment having a tail portion of the light diffusion layer and a tail portion of the white layer).
Figure 5B:
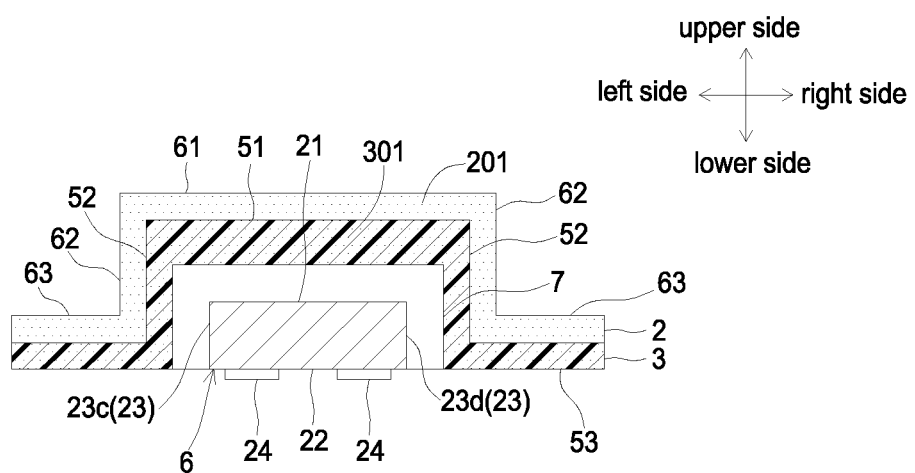

Thus, the three-layer coated element 5 illustrated in FIGS. 5A to 5B is obtained.

As illustrated in FIGS. 5A to 5B, the light diffusion layer 3 of the three-layer coated element 5 includes a light diffusion layer upper part 51 arranged on the upper surface of the phosphor layer 7; a light diffusion layer side part 52 covering the side of the phosphor layer 7; and a light diffusion layer tail part 53, which protrudes sideward from the lower end of the light diffusion layer side part 52. A thickness of the light diffusion layer upper part 51 (length in the vertical direction), a thickness of the light diffusion layer side part 52 (length in the front-back direction/length in the right-left direction), and a thickness of the light diffusion layer tail part 53 (length in the vertical direction) are the same.

The white layer 2 includes a white layer upper part 61 arranged on the upper surface of the light diffusion layer upper part 51; a white layer side part 62 covering the side of the light diffusion layer side part 62; and a white layer tail part 63 protruding sideward from the lower end of the white layer side part 62. A thickness of the white layer upper part 61 (length in the vertical direction), a thickness of the white layer side part 62 (length in the front-back direction/length in the right-left direction), and a thickness of the white layer tail part 63 (length in the vertical direction) are the same.

The manufacturing method of the three-layer coated element 5 according to the embodiment is illustrated in FIGS. 5A and 5B also provides the same effects as the manufacturing method illustrated in FIGS. 4A to 4F.

(3) In the embodiment illustrated in FIGS. 2A to 2F, the coating sheet 1 can indirectly coat on the optical semiconductor element 6. That is, the coating sheet 1 can cover the phosphor layer-coated element 8. However, for example, although not shown, the coating sheet 1 can directly cover the optical semiconductor element 6.

That is, the coating sheet 1 may be arranged on the optical semiconductor element 6 not including the phosphor layer 7, so that the light diffusion layer 3 contacts the upper surface of the optical semiconductor element 6. This embodiment also provides the same effects as the embodiment illustrated in FIG. 2.

(4) Moreover, the embodiment illustrated in FIGS. 2A to 2F, the coating sheet 1 can cover the phosphor layer-coated element 8. However, for example, although not shown, the optical semiconductor device can be covered by the coating sheet 1. That is, with the optical semiconductor device which has the optical semiconductor element 6 disposed on the substrate 15, the optical semiconductor 6 can be covered by the covering sheet 1. This embodiment provides the same effects as the embodiment illustrated in FIGS. 2A to 2F.

Embodiments

A specific value of a mixing ratio (content ratio), a physical property value, a parameter or the like, used in the following description, can be replaced by the upper limit value (value defined as "less than") or the lower limit value (value defined as "larger than" or "more than") of the corresponding mixing ratio (content ratio), the physical property value, the parameter or the like, described in the aforementioned "Detailed description of the preferred embodiments".

<Preparation of Silicone Resin Composition>

A phenyl-based silicone resin composition in the A-stage (one-stage reaction-curable resin that can be a state of the B-stage) is prepared by the method described in the embodiments of Japanese Unexamined Patent Application Publication No. 2016-037562.

Next, the phenyl-based silicone resin composition in the A-stage is heated at 100° C. for 1 hour (completely cured and changed to the C-stage), and a product is obtained. A ratio of phenyl groups with respect to hydrocarbon groups directly bonded to silicon atoms (mol %) is estimated by measuring the $^{29}$Si-NMR of the obtained product, and has a result 48%.

A refractive index of the phenyl-based silicone resin composition in the C-stage is measured by an Abbe refractometer and has a result 1.56.

<Material Used in the Embodiments>

Titanium oxide: white particles 201 have an average particle diameter of 0.36 μm. The product name is "R70S" and manufactured by DuPont; Silica particles: light-diffusing particles 301 have a refractive index of 1.45, and average particle diameter of 3.4 μm. The product name is "FB-3SDC" and manufactured by DENKA Co. Ltd.;

Glass particles: filler has a refractive index of 1.55. The composition and composition ratio (mass %) is inorganic particles of $SiO_2/Al_2O_3/CaO/MgO=60/20/15/5$. An average particle diameter is 20 μm.

Fumed silica: thixotropy-imparting particles have an average particle diameter of 7 nm. The product name is "R976S" and manufactured by Evonik Co. Ltd.

Embodiment 1

A white resin composition is prepared by mixing 46.6 mass % of silicone resin composition, 3.0 mass % of titanium oxide, and 48.5 mass % of glass particles, and 1.9 mass % of fumed silica. The white resin composition is applied on a release sheet (a separator, the product name is "SE-1", has a thickness of 50 μm, and manufactured by Fujiko Co. Ltd.) by using a comma coater. A white layer in the C-stage is formed by heating at 120° C. for 10 minutes. The thickness of the white layer is 100 μm.

Next, a light diffusion composition is prepared by mixing 41.4 mass % of the silicone resin composition, 40 mass % of silica particles, and 18 mass % of glass particles, and 0.6 mass % of fumed silica. The light diffusion composition is applied on the white layer by using the comma coater. A light diffusion layer in the B-stage is formed by heating at 80° C. for 10 minutes. The thickness of the light diffusion layer is 150 μm.

Thereby, a coating sheet supported by the release sheet includes the white layer and the light diffusion layer.

Embodiment 2 to 15

A coating sheet is prepared by the same method as that of the embodiment 1, except that the mixing ratio of titanium oxide in the white resin composition (i.e. white layer), the mixing ratio of silica particles in the light diffusion composition (i.e. light diffusion layer), the thickness of the white layer, and the thickness of the light diffusion layer are changed to the mixing ratios and thicknesses listed in TABLE 1.

COMPARATIVE EXAMPLE 1

A coating sheet is prepared by the same method as that of the embodiment 1, except that titanium oxide is not mixed into the white resin composition. That is, the coating sheet of the comparative example 1 is formed of a non-white layer (transparent layer) and a light diffusion layer.

COMPARATIVE EXAMPLE 2

A coating sheet is prepared by the same method as that of the embodiment 1, except that silica particles are not mixed into the light diffusion composition. That is, the coating sheet of the comparative example 2 is foamed of a white layer and a non-light diffusion layer (a transparent layer).

Embodiment 16

A coating sheet is prepared by the same method as that of the embodiment 1, except that the mixing ratio of silica particles in the light diffusion layer and the thickness of the white layer are changed to another mixing ratio and another thickness listed in TABLE 1, and the heating condition for the light diffusion composition is set to 80° C. and 20 minutes.

(Measurement of Thickness)

The thickness of the light diffusion layer and the thickness of the white layer are measured by using a measuring instrument (linear gauge, manufactured by Citizen Co. Ltd.).

(Measurement of Lightness)

Lightness of each of the coating sheet of the embodiments and the comparative examples is measured by using an ultraviolet-visible near infrared spectrophotometer, and is measured by using a transmittance measuring method in an integrating sphere.

Specifically, the coating sheet of each of the embodiments and the comparative examples is obtained by making the light diffusion layer contacting the slide glass and heat-pressed under a condition of 90° C., 0.1 MPa, and 10 minutes. Subsequently, the release sheet is peeled off, and heated at 150° C. for 120 minutes, the light diffusion layer is changed to the C-stage. Thus, a sample for lightness measurement (laminated body of slide glass/light diffusion layer/white layer) is obtained.

Next, a reference measurement is measured by only setting a slide glass in the ultraviolet-visible near infrared spectrophotometer ("V-670", manufactured by JASCO) and emitting with light having a wavelength of 380 nm to 780 nm. Thereafter, a sample is set to be irradiated by the light with the same wavelength as above to measure a transmission spectrum of the sample. From the transmission spectrum, a lightness L* of the covering sheet is calculated by a reference according to JIS Z 8781-4: 2013. The results are shown in TABLE 1.

The light diffusion layer in the B-stage before changing to the C-stage is also measured by the same method as described above and can have the same lightness as that of the light diffusion layer in the C-stage.

(Measurement of Emitting Angle of Light Diffusion Layer)

A measuring sample of each of the embodiments and the comparative examples for measuring the emitting angle is prepared by arranging the light diffusion layer 3 on a slide glass 70.

Figure 6:
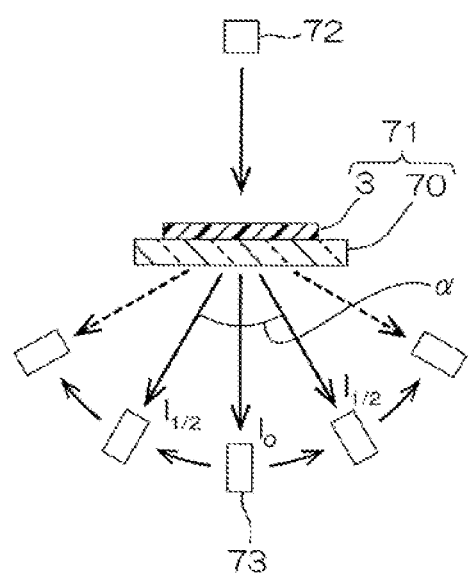
FIG. 6 is a diagram depicting a device for measuring an emitting angle of the light diffusion layer according to the embodiment.

Next, a spectroscopic angle color difference meter (GCM5000, manufactured by Nippon Denshoku Industries Co. Ltd.) is provided. A light source 72 is fixed on an upper side of the measuring sample 71 with a space (5 cm), and a detector is arranged on a lower side of the sample 71 with a space (3 cm) (See FIG. 6).

Then, the measuring sample 71 is irradiated by an incident light (C light source) emitted from the light source 72.

A front light at an angle of 0° is measured by a transmitted light that passes through the measuring sample 71 and reaches right under the light source 72. A front light has intensity $I_0$. Subsequently, the detector 73 is moved to an oblique direction (−60° to 60°) from the front (0°), and an intensity of the transmitted light in the oblique direction is measured.

An angle, at which an intensity is a half of the intensity $I_0$ of the front light ($I_{1/2}$), is measured. And an angle range α, in which the intensity is larger than the half of the intensity $I_0$, is calculated. The results are shown in TABLE 1.

(Measurement of Dynamic Viscoelasticity of Phosphor Layer (Measurement of Shear Storage Modulus G'))

A dynamic viscoelasticity of the phosphor layers in the B-stage is obtained in the embodiments 1 and 16 under the following conditions:

[Conditions]

Viscoelastic device: rotary rheometer (C-VOR device, manufactured by Malvern Panalytical Ltd.);

Sample shape: disk shape;

Sample dimension: thickness is 225 μm, and diameter is 8 mm;

Strain amount: 10%;

Frequency: 1 Hz;

Plate diameter: 8 mm;

Inter-plate gap: 200 μm;

Temperature increasing rate: 20° C./minute; and

Temperature range: 20° C. to 200° C.

Figure 7:
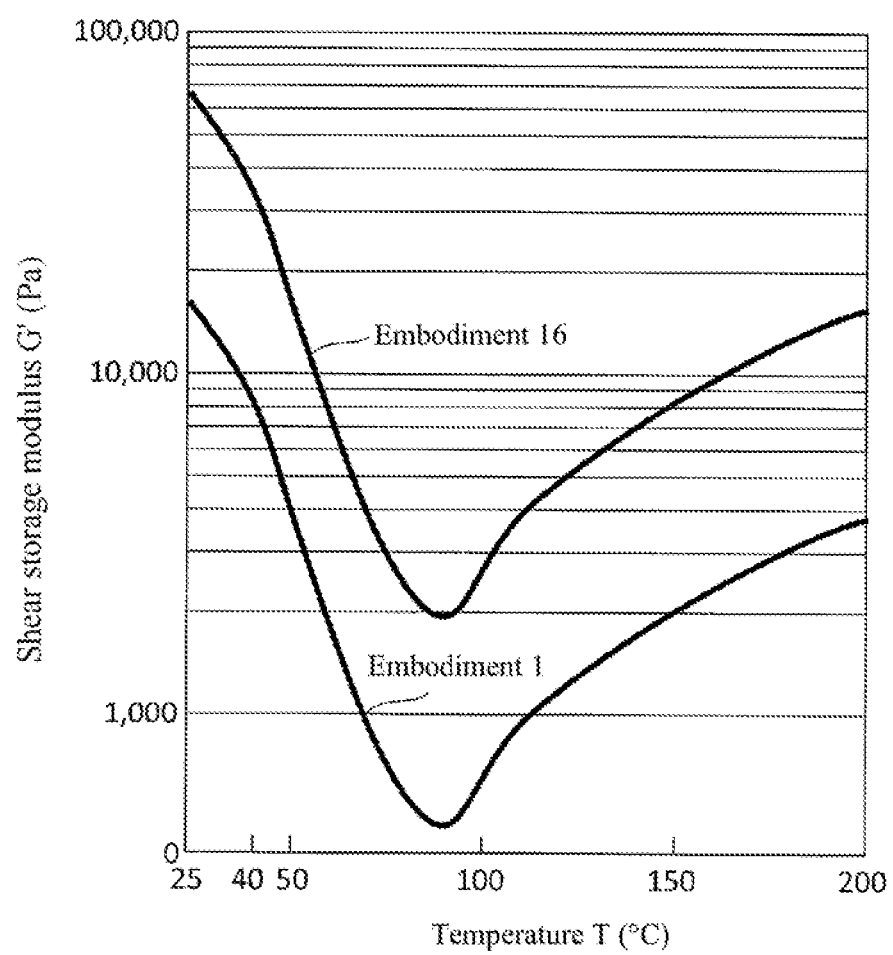
FIG. 7 is a diagram showing a relation between the shear storage modulus G' of the phosphor layer and the temperature T according to the embodiment.

A curve shown in FIG. 7 is the relationship between the temperature T and the shear storage modulus G'.

The minimum value of the shear storage modulus G' of the light diffusion layer in the embodiment 1 is 25 Pa. Moreover, the minimum value of the shear storage modulus G' of the light diffusion layer in the embodiment 16 is 1980 Pa.

(Method of Manufacturing Three-Layer Coated Element A)

A plurality of phosphor layer-coated elements (square shape with 1.1 mm of each side, thickness of 150 μm, manufactured by Epistar Co. Ltd.), which has an approximately rectangular shape in a plan view, is prepared. The upper surface and a side surface of the optical semiconductor element of the phosphor layer-coated element are covered by a phosphor layer (containing yellow phosphor). A thickness of the phosphor layer arranged on the upper surface of the optical semiconductor element is 200 µm.

Next, a temporary fixing sheet, having a supporting plate (stainless steel carrier) and an adhesive sheet ("Revalpha", manufactured by Nitto Denko corporation) arranged on an upper surface of the support plate, is provided.

The phosphor layer-coated elements are arranged in sequence on the temporary fixing sheet, at intervals of 1.77 mm, five in the front-back direction and five in the right-left direction, so that an electrode on a lower surface of the optical semiconductor element is embedded in the adhesive sheet (FIG. 2A). Thus, a phosphor layer-coated element assembly is obtained.

Next, the phosphor layer-coated element assembly is fixed to an upper surface of the lower plate of the hot pressing machine, wherein the phosphor layer-coated element is arranged on the upper side. The coating sheet of any of the embodiments 1 to 15 and the comparative examples is fixed on the lower surface of the upper plate of the hot pressing machine, wherein the light diffusion layer is arranged on the lower side (FIG. 2B). Thereafter, a hot pressing is performed under conditions of 90° C., 0.1 MPa, and 10 minutes. At this time, the hot pressing is performed so that the light diffusion layer arranged on the upper surface of the phosphor layer-coated element is compressed by 10 µm, that is, the thickness of the light diffusion layer on the upper surface of the phosphor layer of the three-layer coated element is thinner than that of the light diffusion layer of the coating sheet before laminating by 10 µm (FIG. 2C). Specifically, the thickness of the light diffusion layer of the coating sheet is 150 µm, the thickness of the light diffusion layer of the three-layer coated element after the hot pressing is 140 µm.

Then, the release sheet is peeled off, and the three-layer coated element is heated in an oven at 150° C. for 120 minutes so as to change the light diffusion layer to the C-stage (FIG. 2D).

Next, the white layer and the light diffusion layer arranged between the adjacent optical semiconductor elements are cut by dicing to separate into individual pieces. Afterwards, the temporary fixing sheet is peeled off (FIG. 2E).

Thereby, the three-layer coated element A is prepared.

(Method of Manufacturing Three-Layer Coated Element B)

The phosphor layer-coated element assembly is obtained by the same method as the aforementioned method (FIG. 4A).

Next, a material for forming the light diffusion layer side part is made of the light diffusion composition prepared in the embodiment 16. The light diffusion layer side part is formed by filling the light diffusion composition between the phosphor layer-coated elements, and heating. The upper surface of the light diffusion layer side part and the upper surface of the optical semiconductor element are coplanar (FIG. 4B).

Then, the phosphor layer-coated element assembly is fixed to the upper surface of the lower plate of the hot pressing machine, wherein the phosphor layer-coated element is arranged on the upper side. The coating sheet of the embodiments 16 is fixed on the lower surface of the upper plate of the hot pressing machine, wherein the light diffusion layer is arranged on the lower side (FIG. 4C). Thereafter, the hot pressing is performed under conditions of 90° C., 0.1 MPa, and 2 minutes. At this time, the light diffusion layer arranged on the upper surface of the phosphor layer-coated element is not compressed. That is, the thickness of the light diffusion layer on the upper surface of the phosphor layer of the three-layer coated element is the same as the thickness of the light diffusion layer of the coating sheet before laminating.

Then, the release sheet is peeled off, and the three-layer coated element is heated in an oven at 150° C. for 120 minutes so as to change the light diffusion layer to the C-stage (FIG. 4E).

Next, the white layer and the light diffusion layer arranged between the adjacent optical semiconductor elements are cut by dicing to separate into individual pieces. Afterwards, the temporary fixing sheet is peeled off (FIG. 4F).

Thereby, the three-layer coated element B is prepared.

(Measurement of Color Uniformity in Angle Direction)

An optical semiconductor device is formed by flip mounting the three-layer coated element A or B of any of the embodiments and the comparative examples on a diode substrate. An electric current of 300 mA is applied to the optical semiconductor device to cause the optical semiconductor device to emit light. A chromaticity (CIE, y) of light emitted in an oblique direction (−60° to 60°) from the front direction (0°:upward direction) is measured to obtain a difference ($\Delta u'v'$) between a chromaticity of light at 0° and a chromaticity of light at 60°.

The measurement is measured by a multi-channel spectroscope ("MCPD-9800", manufactured by Otsuka Electronics Co. Ltd.)). The results are shown in TABLE 1.

Note that when the difference ($\Delta u'v'$) is less than 0.0040, a yellow ring is invisible and it can be determined to be excellent. Moreover, when the difference is greater than 0.040, and less than 0.0050, a yellow ring is almost invisible and it can be determined to be good. When the difference is greater than 0.0050 and less than 0.0060, a yellow ring is barely visible and it can be determined to be fair. When the difference is greater than 0.0050, a yellow ring is clearly visible and it can be determined to be poor.

(Appearance of Three-Layer Coated Element)

The appearance of three-layer coated elements A and B of the embodiments and the comparative examples are visible from the white layer side, and evaluated as follows. The results are shown in TABLE 1.

⊚: a color (yellow) of the base (phosphor layer) is invisible;

○: the color of the base is almost invisible;

Δ: the color of the base is barely visible; and x: the color of the base could be clearly visible.

(Measurement of Lightness of Three-Layer Coated Element)

An optical semiconductor device is formed by flip mounting the three-layer coated element A or B of any of the embodiments and the comparative examples on the diode substrate. An electric current of 300 mA is applied to the optical semiconductor device, and a total light flux is measured. Note that the measurement is performed by using a multi-channel spectrometer ("MCPD-9800" manufactured by Otsuka Electronics Co. Ltd.), under a measurement condition of an exposure time of 19 ms and a number of repetitions of 16. The results are shown in TABLE 1.

TABLE 1

|  |  |  | embodiment 1 | embodiment 2 | embodiment 3 | embodiment 4 | embodiment 5 | embodiment 6 | embodiment 7 | embodiment 8 | embodiment 9 |
|---|---|---|---|---|---|---|---|---|---|---|---|
| coating sheet | reflection layer | content ratio of titanium oxide (wt %) | 3.0 | 3.0 | 3.0 | 3.0 | 3.0 | 3.0 | 3.0 | 3.0 | 3.0 |
|  |  | film thickness (μm) | 100 | 84 | 110 | 100 | 100 | 30 | 200 | 100 | 100 |
|  | diffusion layer | content ratio of silica (wt %) | 40 | 40 | 40 | 30 | 50 | 40 | 40 | 40 | 40 |
|  |  | film thickness (μm) | 150 | 150 | 150 | 150 | 150 | 150 | 150 | 100 | 200 |
|  |  | emitting angle | 110 | 110 | 110 | 107 | 115 | 110 | 110 | 106 | 115 |
| three-layer coated element | lightness | L* | 60.9 | 62.5 | 60.0 | 61.6 | 60.3 | 67.7 | 51.2 | 60.5 | 60.1 |
|  | angle dependence of chromaticity | Δu'v' | 0.0033 | 0.0037 | 0.0031 | 0.0034 | 0.0031 | 0.0039 | 0.0030 | 0.0033 | 0.0031 |
|  | appearance | whiteness | ◎ | ◎ | ◎ | ◎ | ◎ | Λ | ◎ | ◎ | ◎ |
|  | brightness | total light flux (lm) | 203 | 210 | 199 | 207 | 201 | 233 | 161 | 202 | 200 |

|  |  |  | embodiment 10 | embodiment 11 | embodiment 12 | embodiment 13 | embodiment 14 | embodiment 15 | embodiment 16 | comp. example 1 | comp. example 2 |
|---|---|---|---|---|---|---|---|---|---|---|---|
| coating sheet | reflection layer | content ratio of titanium oxide (wt %) | 1.0 | 5.0 | 5.3 | 3.0 | 3.0 | 3.0 | 3.0 | 0.0 | 3.0 |
|  |  | film thickness (μm) | 100 | 100 | 30 | 150 | 100 | 100 | 100 | 100 | 100 |
|  | diffusion layer | content ratio of silica (wt %) | 40 | 40 | 40 | 40 | 10 | 5 | 46 | 40 | 0 |
|  |  | film thickness (μm) | 150 | 150 | 150 | 150 | 150 | 150 | 30 | 100 | 200 |
|  |  | emitting angle | 110 | 110 | 110 | 110 | 50 | 30 | 103 | 110 | 10 |
| three-layer coated element | lightness | L* | 66.6 | 55.7 | 61.3 | 56.1 | 61.0 | 61.2 | 60.9 | 84.9 | 61.4 |
|  | angle dependence of chromaticity | Δu'v' | 0.0038 | 0.0030 | 0.0034 | 0.0031 | 0.0045 | 0.0058 | 0.0033 | 0.0039 | 0.0073 |
|  | appearance | whiteness | ○ | ◎ | ◎ | ◎ | ◎ | ◎ | ◎ | X | ◎ |
|  | brightness | total light flux (lm) | 229 | 180 | 205 | 182 | 204 | 205 | 203 | 246 | 205 |

Note that although the above-described invention is provided as an exemplary embodiment of the present invention, the embodiment is merely illustrative, and should not be restrictively interpreted. Variations of the present invention, which are apparent for a person skilled in the art, are included in following claims.

INDUSTRIAL APPLICABILITY

The sheet used for coating an optical semiconductor element according to the present invention can be applied to various industrial products, and can be used for, for example, a light-emitting device such as a white light semiconductor device.

REFERENCE SIGNS LIST

1 coating sheet
2 white layer
3 light diffusion layer
6 optical semiconductor element

What is claimed is:

1. A sheet, in an order in a thickness direction, comprising:
    a white layer containing white particles; and
    a light diffusion layer, containing light-diffusing particles, wherein the white layer covers a whole surface of the light diffusion layer and has a uniform thickness, and wherein the sheet is configured to directly coat an optical semiconductor element.

2. The sheet according to claim 1, wherein a lightness L* in the thickness direction of the sheet is larger than 51.2 and less than 67.7.

3. The sheet according to claim 2, wherein the lightness L* in the thickness direction of the sheet is larger than 55.7 and less than 66.6.

4. The sheet according to claim 1, wherein an emitting angle of the light diffusion layer is larger than 20° and less than 120°.

5. The sheet according to claim 4, wherein the emitting angle of the light diffusion layer is larger than 40° and less than 120°.

6. The sheet according to claim 1, wherein a thickness of the light diffusion layer is larger than 30 μm and less than 600 μm.

7. The sheet according to claim 1, wherein the light diffusion layer contains a B-stage resin.

8. The sheet according to claim 7, wherein a curve indicating a relation between a temperature T and a shear storage modulus G', obtained by measuring a dynamic viscoelasticity under a condition of a frequency of 1 Hz and a temperature increasing rate of 20° C./minute, has a minimum value,
    wherein the temperature T at the minimum value falls within a range of higher than 40° C. and less than 200° C., and wherein the shear storage modulus G' at the minimum value falls within a range of larger than 1000 Pa and less than 90000 Pa.

* * * * *